United States Patent
Inoue et al.

[11] Patent Number: 5,994,748
[45] Date of Patent: *Nov. 30, 1999

[54] TWO-TERMINAL NONLINEAR DEVICE, METHOD FOR MANUFACTURING THE SAME, AND LIQUID-CRYSTAL DISPLAY PANEL

[75] Inventors: Takashi Inoue; Yasushi Takano; Wataru Ito; Tsutomu Asakawa; Takumi Seki; Yasuhiro Yoshimizu, all of Suwa, Japan

[73] Assignee: Seiko Epson Corporation, Tokyo, Japan

[ * ] Notice: This patent is subject to a terminal disclaimer.

[21] Appl. No.: 08/936,545

[22] Filed: Sep. 24, 1997

Related U.S. Application Data

[63] Continuation-in-part of application No. 08/750,042, filed as application No. PCT/JP96/00903, Apr. 1, 1996, Pat. No. 5,867,234.

[30] Foreign Application Priority Data

Mar. 31, 1995 [JP] Japan ..................................... 7-100371
Mar. 25, 1997 [JP] Japan ..................................... 9-090312

[51] Int. Cl.$^6$ .................................................. H01L 29/78
[52] U.S. Cl. ............................................ 257/410; 349/52
[58] Field of Search .............................. 349/52; 257/410, 257/411, 629–651

[56] References Cited

FOREIGN PATENT DOCUMENTS

| | | |
|---|---|---|
| 62-150787 | 7/1987 | Japan . |
| 63-50081 | 3/1988 | Japan . |
| 64-63929 | 3/1989 | Japan . |
| 2-301727 | 12/1990 | Japan . |
| 6-75250 | 3/1994 | Japan . |

*Primary Examiner*—David B. Hardy
*Attorney, Agent, or Firm*—Oliff & Berridge, PLC

[57] ABSTRACT

A MIM nonlinear device is provided having a large nonlinearity coefficient that represents the sharpness of the voltage-current characteristic. A liquid-crystal display panel may be manufactured using the device to exhibit high image-quality. A method for manufacturing such a MIM nonlinear device is also provided. A MIM nonlinear device may include a first conductive film, an insulating film and a second conductive film laminated on a substrate. The insulating film may contain water at a content gradient descending in the direction of the film thickness from the surface facing the second conductive film. The hydrogen spectrum that is derived from the water and obtained by a secondary ion-mass spectrography (SIMS) elemental analysis with the radiation of cesium primary ions exhibits a peak near a surface of the insulating film facing the second conductive film. Additionally, the thermal desorption spectroscopy of the insulating film has a peak derived from water in the insulating film within a range of 220° C.±5° C.

8 Claims, 17 Drawing Sheets

ABackslash# TWO-TERMINAL NONLINEAR DEVICE, METHOD FOR MANUFACTURING THE SAME, AND LIQUID-CRYSTAL DISPLAY PANEL This is a Continuation-in-Part of application Ser. No. 08/750,042, filed Nov. 29, 1996, now U.S. Pat. No. 5,867,234, which is a U.S. National Stage of International Application PCT/JP96/00903, filed Apr. 1, 1996.

BACKGROUND OF THE INVENTION

1. Field of Invention

The present invention relates to a two-terminal nonlinear device used as a switching device, a method for manufacturing the two-terminal nonlinear device, and a liquid-crystal display panel including the two-terminal nonlinear device.

2. Description of Related Art

An active matrix-type liquid-crystal display may include an active-matrix substrate in which a switching device is provided for each pixel area to form a matrix array. Liquid crystals may be packed between opposing substrates provided with color filters. In such a liquid-crystal display, alignment of the liquid crystal in each pixel area is controlled to display desired image information. In general, a three-terminal device such as a thin film transistor (TFT) or a two-terminal device such as a metal/insulating material/metal (MIM) nonlinear device is used as a switching device. A two-terminal device used as a switching device is more advantageous than a three-terminal device since two-terminal devices are free of cross-over shorting and can be manufactured by a simpler process.

Japanese Unexamined Patent Publication No. 63-50081 discloses a technique for improving nonlinearity of a MIM nonlinear device. In this technique, a tantalum film is subjected to anodic oxidation and heat-treated at 400° C. to 600° C. in a nitrogen atmosphere to improve nonlinearity, especially sharpness of the voltage-current characteristic. However, sufficient nonlinearity has not yet been achieved even by this technique.

SUMMARY OF THE INVENTION

An object of the present invention is to provide a two-terminal nonlinear device that exhibits a sufficiently sharp voltage-current characteristic and superior resistance characteristics and a liquid-crystal display panel that includes such devices and is capable of high contrast displaying without image irregularity and sticking, but with a high image quality.

Another object of the present invention is to provide a method for manufacturing a two-terminal nonlinear device having the above desirable characteristics.

The two-terminal nonlinear device (hereinafter referred to as "MIM nonlinear device") according to present invention may include a first conductive film, an insulating film and a second conductive film that are laminated on a substrate. The insulating film may contain water at a content gradient descending in the direction of the film thickness from the surface facing the second conductive film.

In the MIM nonlinear device according to the present invention, the second conductive film is not limited to a metal film and may be an ITO (Indium Tin Oxide) conductive film or the like.

Since the insulating film may contain water, and particularly, since the content of water is higher near the insulating film surface facing the second conductive film, the nonlinearity coefficient ($\beta$ value) that represents the sharpness of the voltage-current characteristic, can be markedly improved.

The profile of water contained in the insulating film according to the present invention may be illustrated as follows. The hydrogen spectrum of water in the insulating film obtained by a secondary ion-mass spectrography (SIMS) elemental analysis with the radiation of cesium primary ions exhibits at least one peak near the insulating film surface facing the second conductive film, and more preferably, within a range from the surface to 30 nm deep. Further, the intensity of the hydrogen spectrum of the water according to the SIMS elemental analysis preferably varies in the insulating film by at least one order of magnitude. Additionally, the thermal desorption spectroscopy of the insulating film preferably has a peak derived from water in the insulating film within a range of 220° C.±5° C.

The first conductive film may include tantalum or a tantalum alloy. Further, the insulating film is preferably formed by anodic oxidation of the first conductive film.

The method for manufacturing the MIM nonlinear device according to the present invention may include:

(a) a step of forming a first conductive film on a substrate;

(b) a step of forming an insulating film on the first conductive film;

(c) a first thermal treatment step in which the substrate provided with the first conductive film and the insulating film is treated in an atmosphere containing water vapor, and at least the insulating film is forced to contain water; and (d) a step of forming a second conductive film on the insulating film. The steps performed after the first thermal treatment are carried out under the conditions of inhibiting water desorption from the insulating film.

According to this manufacturing method, the MIM nonlinear device according to the present invention can be obtained by employing a simple thermal treatment. Further, in this manufacturing method, the steps carried out after the first thermal treatment for providing the insulating film with water are preferably performed at a temperature lower than 200° C. in order to restrict the desorption of water from the insulating film to an extent as low as possible. Examples of such steps carried out after the first thermal treatment include a step of forming a second conductive film just after the treatment, a step of forming pixel electrodes, a step of heat-treating a resist used for processing the second conductive film or the pixel electrodes, a heat-treating step performed before coating the resist, and a step of baking the pixel electrodes. Some of these steps may be performed at 200° C. or higher and the temperature may be made as uniform as possible throughout the substrate such that the desorption of water from the insulating film occurs uniformly. The activity to make the substrate as uniform as possible in temperature may mean to restrict the temperature difference within the substrate to ±10° C. or less, and more preferably, to ±5° C. or less.

In the first thermal treatment, the concentration of water vapor relative to the entire treatment gas is preferably 0.001 mol % or more, and more preferably, 0.014 to 2 mol %. Preferably, this first thermal treatment (annealing A) is carried out as a temperature-descending step continuously after a second thermal treatment (annealing B) in which the substrate provided with the first conductive film and the insulating film is heat-treated in an inert gas.

The insulating film of the MIM nonlinear device may have a structure of joined insulating materials having different energy levels of their conductive segments. As a result, when a low voltage is applied to the MIM nonlinear device, the resistance of the device is large and the β value is also large.

In a MIM nonlinear device manufactured by a method including the above-described annealing A, the insulating film has a structure including a first layer that contains water and is closer to the film surface facing the second conductive film, and a second layer that does not substantially contain water and is closer to the first conductive film. Thus, the insulating film has conductive segments at different energy levels. More specifically, the conductive segment of the first layer containing water has an energy level lower than that of the second layer. Accordingly, when a low voltage (such as 5 V or below) is applied to the MIM nonlinear device, the resistance of the device becomes large to dissolve the energy difference between the conductive segments in the insulating film. Meanwhile, when a high voltage (such as 10 V or higher) is applied to the MIM nonlinear device, the resistance of the device varies little since the energy difference within the insulating film does not substantially influence the electric conduction. Due to this, the voltage-current characteristic of the MIM nonlinear device is sharpened. Hereupon, the resistance R of the device can be expressed by the following formula.

$$R = 1/\alpha \exp(\beta Vi^{1/2} - Eg/\kappa T) + Vs/\lambda \exp(qVs/\kappa T)$$

where,

α=Electrical conductivity at room temperature when no voltage is applied to the MIM nonlinear device;
β=Sharpness of the voltage-current characteristic;
Vi=Voltage applied to the insulating film;
Eg=Activation energy;
κ=Bolzmann's constant;
T=Absolute temperature;
Vs=Voltage applied to the interface between the first layer and the second layer of the insulating film;
λ=Constant; and
q=Electric charge of an electron.

In the above formula, the first term relates to the conduction of the insulating film according to Pool-Frenkel conduction and the second term relates to energy difference between the conductive segments in the insulating film. In other words, the second term is based on regular-directional conduction through the pn junction when the first layer is assumed to be a n-type semiconductor while the second layer is assumed to be a p-type semiconductor in a qualitative view of the insulating film.

Additionally, the liquid-crystal display panel of the present invention may include the above-described MIM nonlinear device. More specifically, the liquid-crystal display panel may include a first substrate including a transparent substrate, one signal line disposed on this substrate in accordance with a predetermined pattern, a plurality of MIM nonlinear devices according to the present invention connected to this signal line and pixel electrodes connected to the MIM nonlinear devices. The liquid-crystal display panel may further include a second substrate provided with another signal line in a position opposite to the pixel electrodes and a liquid crystal layer sealed between the first and second substrates.

According to this liquid-crystal display panel, images can be displayed at a high contrast without sticking, and therefore, with high quality. The liquid-crystal display panel can, therefore, be used for a large variety of purposes.

Other objects, advantages, and salient features of the invention will become apparent from the following detailed description taken in conjunction with the annexed drawings, which disclose preferred embodiments of the invention.

BRIEF DESCRIPTION OF THE DRAWINGS

The invention will be described with reference to the following drawings in which like numerals refer to like elements and wherein.

DETAILED DESCRIPTION OF PREFERRED EMBODIMENTS

Figure 1:
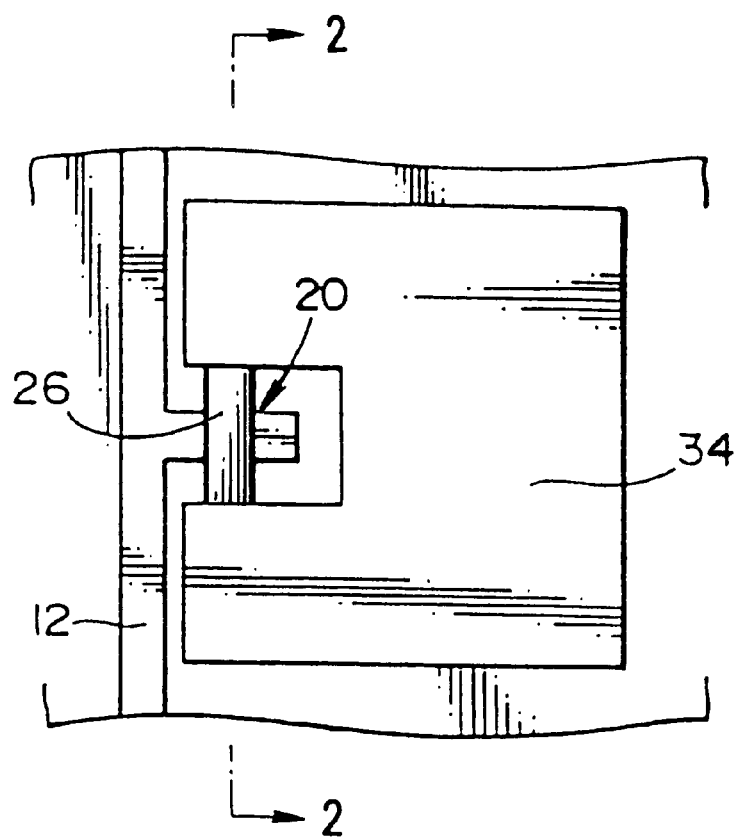
FIG. 1 is a view showing a liquid-crystal display panel manufactured using the MIM nonlinear device according to a first embodiment of the present invention.
Figure 2:
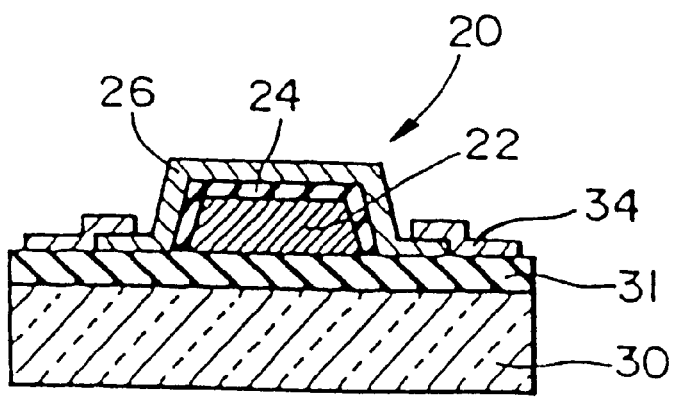
FIG. 2 is a sectional view across the line 2—2 in FIG. 1.

FIG. 1 shows one unit of liquid-crystal-driving electrode formed using a MIM nonlinear device according to a first embodiment of the present invention. FIG. 2 shows the section across line 2—2 in FIG. 1.

The MIM nonlinear device 20 includes a substrate (first substrate) 30 having insulating properties and transparency, such as a substrate including glass, plastic or the like. An insulating film 31 is formed on the substrate 30. A first conductive film 22 including tantalum or a tantalum alloy is formed over the insulating film 31. An insulating film 24 is formed on the first conductive film 22 by anodic oxidation, and a second conductive film 26 is formed on the insulating film 24. Further, the first conductive film 22 of the MIM nonlinear device 20 is connected to a signal line (scanning line or data line) 12 and the second conductive film 26 is connected to pixel electrode 34.

The insulating film 31 may include tantalum oxide. The insulating film 31 prevents the first conductive film 22 from peeling due to a thermal treatment performed after the deposition of the second conductive film 26 and to prevent diffusion of impurities from the substrate 30 into the first conductive film 22. Accordingly, in a case without these problems, this insulating film is not essential.

The first conductive film 22 principally may include sole tantalum or may be an alloy film including a principal component of tantalum and at least one additional element belonging to Group 6, 7 or 8 of the periodic table. Preferred examples of such additional elements include tungsten, chromium, molybdenum, rhenium, yttrium, lanthanum, and dysprosium. An especially preferred element is tungsten, and a preferable content of such element is, for example, 0.1 to 6 atomic %.

The insulating film 24 is preferably formed by anodic oxidation in a treatment solution as described below.

As a feature of the present invention, water may be contained in the insulating film 24 at a content gradient descending in the direction of the film thickness from the surface facing the second conductive film 26. That is, the content of water is higher near the surface of the insulating film 24. More specifically, the hydrogen spectrum of water in the insulating film 24 obtained by a secondary ion-mass spectrography (SIMS) elemental analysis with the radiation of cesium primary ions has a peak near the insulating film surface facing the second conductive film 26. Preferably, this peak in the insulating film 24 appears within a range from the surface facing the second conductive film 26 to 30 nm deep. If water is contained in the surface portion of the insulating film 24, the nonlinearity coefficient that represents the sharpness of the voltage-current characteristic can be markedly improved.

Additionally, the thermal desorption spectroscopy of the insulating film 24 preferably has a peak derived from water in the insulating film 24 within a range of 220° C.±5° C. The method for measuring thermal desorption spectroscopy will be illustrated below.

Although the material of the second conductive film 26 is not especially limited, chromium is ordinarily used. Further, the pixel electrode 34 may include a transparent conductive film such as an ITO film.

Figure 3:
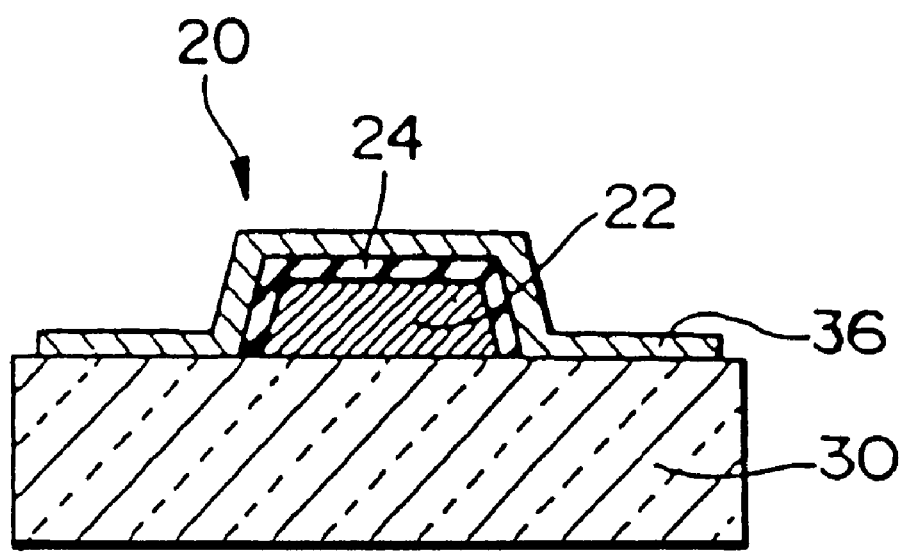
FIG. 3 is a sectional view showing another structural example of the MIM nonlinear device according to the present invention.

As shown in FIG. 3, the second conductive film and the pixel electrode may be integrated within one transparent conductive film 36. If the second conductive film and the pixel electrode are formed with one film, the number of steps for forming the film can be reduced.

An example of a liquid-crystal display panel including the above-described nonlinear devices 20 will now be described.

Figure 4:
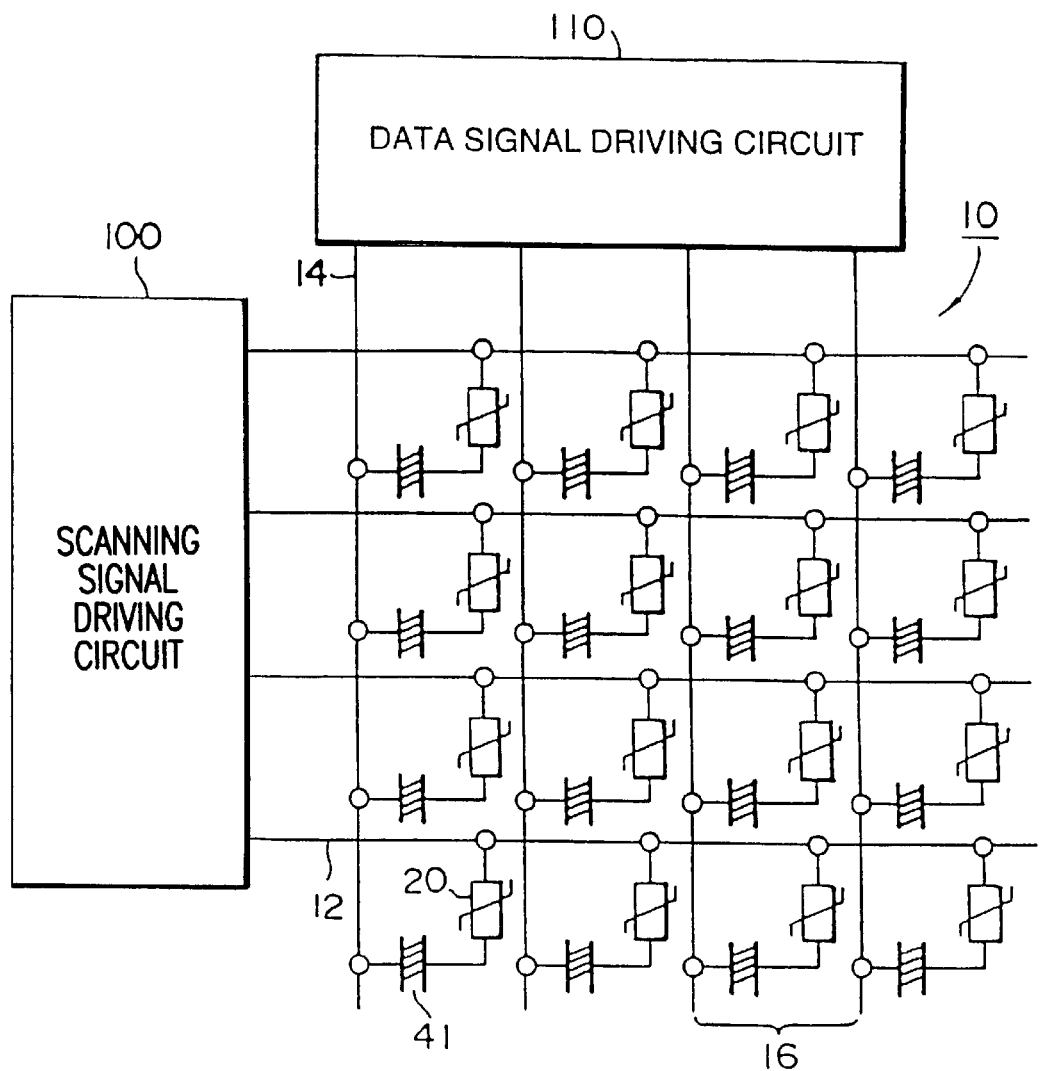
FIG. 4 is a diagram showing a circuit of a liquid-crystal panel according to the present invention.

FIG. 4 shows a circuit of an active-matrix liquid-crystal display panel including the above-described nonlinear devices 20. This liquid-crystal panel 10 includes a scanning signal driving circuit 100 and a data signal driving circuit 110. The liquid-crystal display panel 10 is provided with signal lines, namely, a plurality of scanning lines 12 and a plurality of data lines 14. The scanning lines 12 are driven by the scanning signal driving circuit 100 while the data lines 14 are driven by the data signal driving circuit 110. Moreover, in each pixel area 16, a MIM nonlinear device 20 and a liquid-crystal-displaying element 41 (liquid crystal layer) are connected in series between a scanning line 12 and a data line 14. Although the MIM nonlinear device 20 is connected to the scanning line 12 while the liquid-crystal-displaying element 41 is connected to the data line 14 in FIG. 4, the MIM nonlinear device 20 may be connected to the data line 14 while the liquid-crystal-displaying element 41 may be connected to the scanning line 12.

Figure 5:
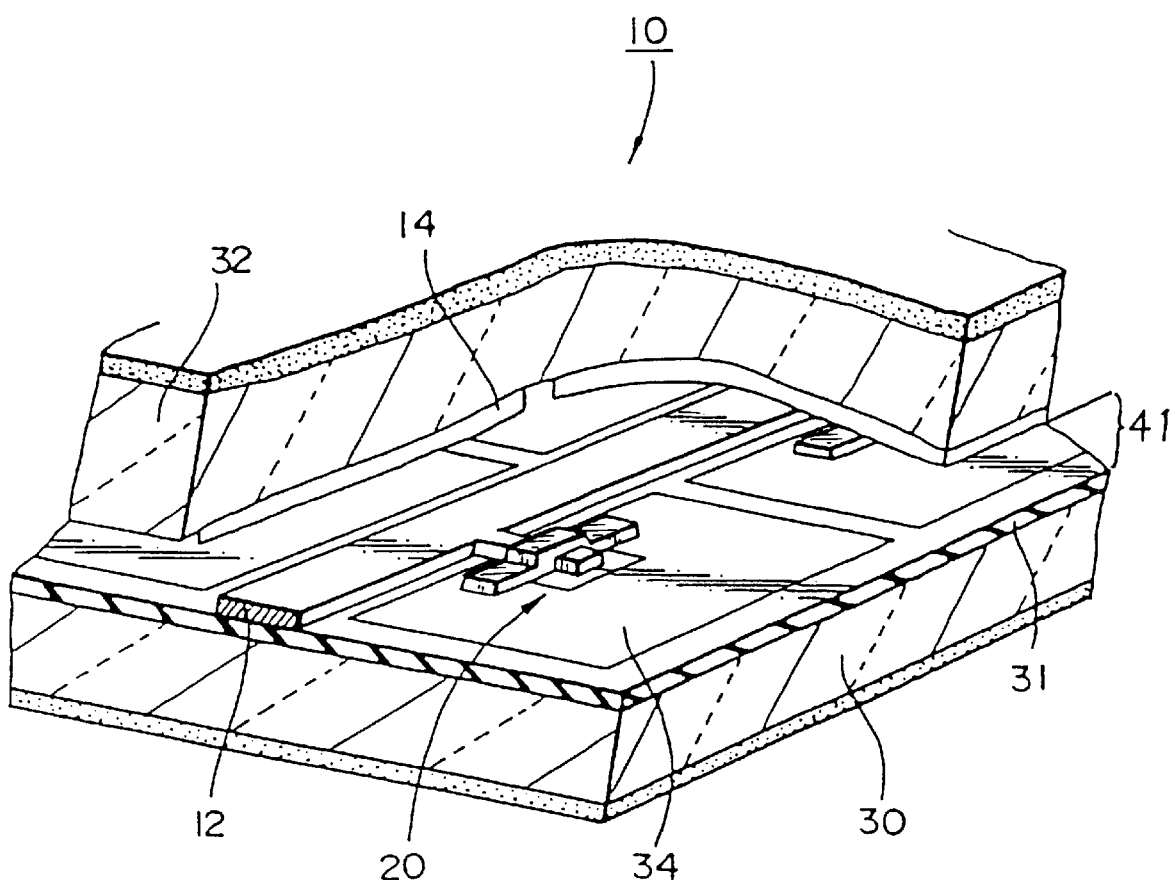
FIG. 5 is a perspective view showing a liquid-crystal panel according to the present invention.

FIG. 5 shows an example of a liquid-crystal display panel according to the present invention. This liquid-crystal display panel 10 includes two substrates, namely, a first substrate 30 and a second substrate 32 disposed oppositely. Liquid crystal is sealed between these substrates 30 and 32 and a liquid-crystal-displaying element 41 (liquid crystal layer) is formed. An insulating film 31 is formed as described above on the first substrate 30. A plurality of signal lines (scanning lines) 12 are formed on this insulating film 31. Meanwhile, the second substrate 32 is provided with a plurality of strip-shaped data lines 14 crossing the scanning lines 12. Further, an pixel electrode 34 is connected to a scanning line 12 through a MIM nonlinear device 20.

Display operation is controlled by switching liquid-crystal-displaying elements 41 into a displaying state, a non-displaying state, or a intermediary state based on the signals applied to the scanning lines 12 and the data lines 14. Any ordinary controlling method can be employed for the display operation.

Figure 6:
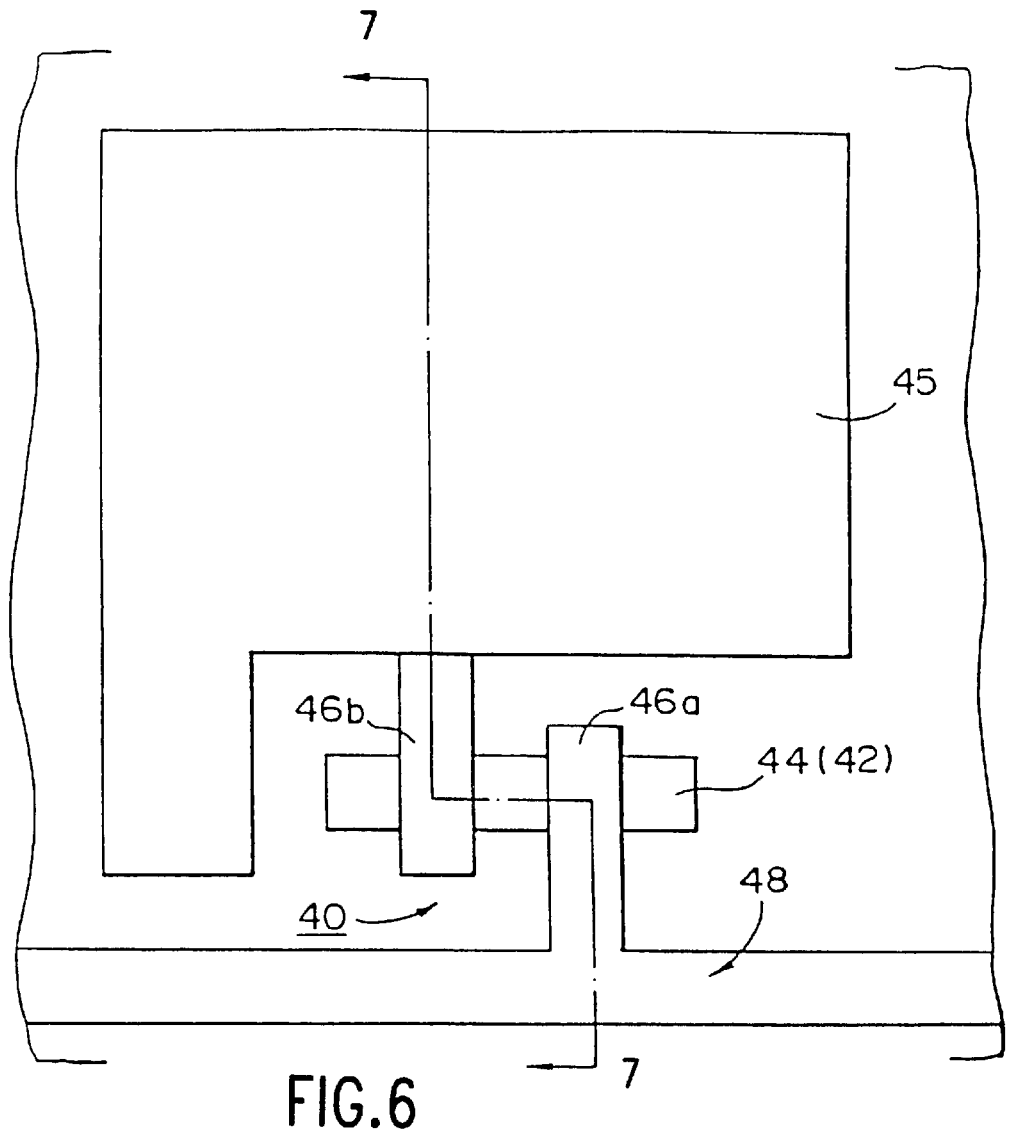
FIG. 6 is a view showing the liquid-crystal display panel manufactured using the MIM nonlinear device having a back-to-back structure according to a second embodiment of the present invention.
Figure 7:
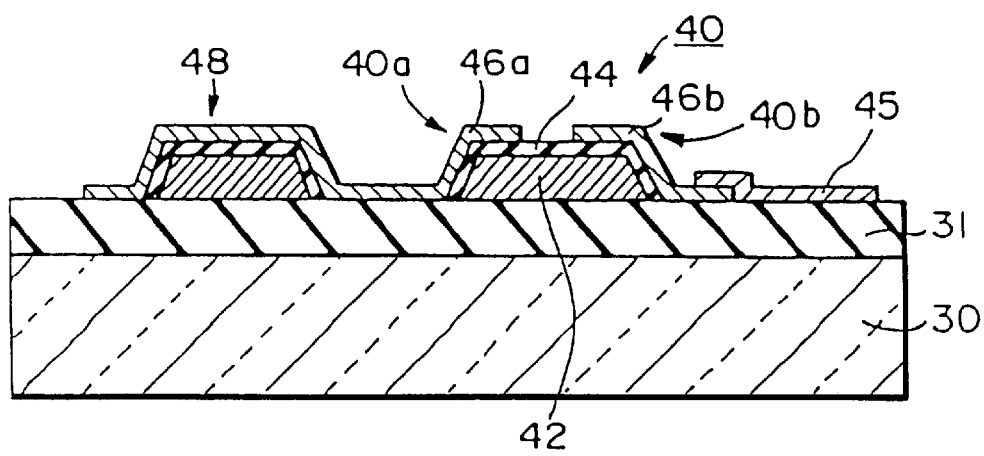
FIG. 7 is a sectional view across the line 7—7 in FIG. 6.

FIGS. 6 and 7 show a second embodiment of the MIM nonlinear device according to the present invention. FIG. 6 shows one unit of liquid-crystal-driving electrode including the MIM nonlinear device of this embodiment and FIG. 7 shows the section across line 7—7 in FIG. 6.

This MIM nonlinear device 40 is different from the above-described MIM nonlinear device 20 in having a back-to-back structure, namely, the MIM nonlinear device 40 has a structure in which a first MIM nonlinear device 40a and a second MIM nonlinear device 40b are connected in series with mutually reverse polarities.

More specifically, a substrate 30 (first substrate) having insulating properties and transparency such as a glass substrate or a plastic substrate is provided and an insulating film 31 is formed on this substrate 30. A first conductive film 42 including tantalum or a tantalum alloy is formed over this layer and an insulating film 44 is formed on the first conductive film 42 by anodic oxidation. Two second conductive films 46a and 46b are mutually-distantly formed on the insulating film 44. Further, the second conductive film 46a as a component of the first MIM nonlinear device 40a is connected to a signal line 48 (scanning line or data line) and the second conductive film 46b as a component of the second MIM nonlinear device 40b is connected to a pixel electrode 45. The insulating film 44 is formed to be thinner than the insulating film 24 in the MIM nonlinear device 20 of a cross type shown in FIGS. 1 and 2. For example, the former has a thickness that is approximately one-half of the latter.

Other properties, the structure and the like of each component such as the first conductive film 42, the insulating film 44 and the second conductive films 46a and 46b are the same in the above-described MIM nonlinear device 20.

Such a MIM nonlinear device having a back-to-back structure exhibits superior symmetry in the voltage-current property compared to the above-described cross-type MIM nonlinear device shown in FIGS. 1 and 2. Exhibiting good symmetry in the voltage-current property means having a sufficiently small difference between the absolute value of a current made to flow from a data line to a pixel electrode at a certain voltage and that of a current made to flow from the pixel electrode to the data line.

A method for manufacturing the MIM nonlinear device 20 shown in FIGS. 1 and 2 will now be described.

Initially, an insulating film 31 including tantalum oxide is formed on a substrate 30. The insulating film 31 can be formed by a method in which a tantalum film is deposited by sputtering and heat-oxidized or by sputtering or co-sputtering using a target including tantalum oxide. Since the purposes of providing the insulating film 31 includes improvement of the adhesion of a first conductive film 22 and prevention of impurity diffusion from the substrate 30, the insulating film 31 is formed to have a thickness of approximately 50 to 200 nm.

Subsequently, a first conductive film 22 including tantalum or a tantalum alloy is formed on the insulating film 31. The thickness of the first conductive film is selected depending on the use of the MIM nonlinear device and ordinarily is approximately 100 to 500 nm. Such a first conductive film can be formed by sputtering or electron beam deposition. For forming a first conductive film including a tantalum alloy, sputtering, co-sputtering or electron beam deposition using a mixed target can be used. Elements belonging to the Group 6, 7, or 8 of the periodic table, and preferably, the above-described elements such as tungsten, chromium, molybdenum and rhenium can be selected as an element in the tantalum alloy.

The first conductive film 22 is patterned according to ordinary photolithographic techniques and etching techniques. Further, signal lines 12 (scanning lines or data lines) are formed according to the same steps as those for forming the first conductive film 22.

Next, an insulating film 24 is formed by oxidizing the surface of the first conductive film 22 according to anodic oxidation. At this time, the surface of each signal line 12 is also oxidized to form an insulating film. The thickness of the insulating film 24 is selected depending on its use and may be approximately 20 to 70 nm. The treatment solution used for anodic oxidation is not especially limited. For example, a 0.01 to 0.1% by weight citric acid solution can be used.

In addition to anodic oxidation, CVD, sputtering, a sol-gel method, heat-oxidation or the like can also be employed for forming the insulating film 24.

Figure 8:
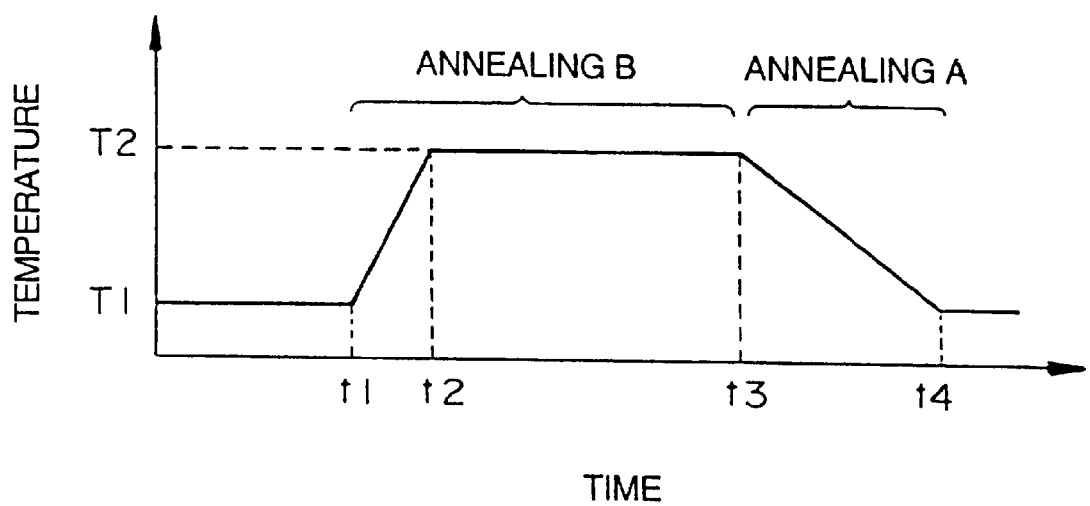
FIG. 8 is a diagram showing the relationship between time and temperature for the thermal treatment in the manufacturing method according to the present invention.

Next, an annealing step including a thermal treatment for introducing water into the insulating film 24 will be described. FIG. 8 shows an example of the relationship between the treating time period and the temperature in an annealing step. The annealing step of this example includes annealing B, which principally comprises a step performed at a constant temperature (T2) and annealing A, which includes a temperature-descending step.

Annealing B includes a temperature-ascending step performed in a time period from T1 to T2 and a constant-temperature step performed in a time period from T2 to T3. Annealing B is carried out in an atmosphere of an inert gas such as a rare gas as argon or nitrogen gas at a temperature T2 of 300° C. or higher, and preferably, 300° C. to 400° C. The time period for the constant-temperature heat-treatment (from T2 to T3) is varied depending on the thickness of the first conductive film, the heat capacity of the annealing furnace, the number of wafers to be processed, the thickness of the substrate glass in the wafer, the set temperature and other factors, and may be approximately 10 to 120 min.

Annealing A is carried out in an atmosphere containing water vapor at a temperature gradient descending from a temperature T2 to a temperature T1. The temperature T1 is preferably 220° C. or below, and more preferably, 200° C. or below, for sufficient absorption of water vapor into the insulating film 24. The time period for annealing A (from T3 to T4) is preferably 10 sec. or longer, more preferably is 2 min. or longer, and furthermore is preferably, 5 to 300 min.

Further, in the temperature-descending step of annealing A, the temperature-descending rate is preferably 0.1° C./min. to 60° C./min., more preferably is 0.5° C./min. to 40° C./min., and furthermore is preferably 0.5° C./min. to 10° C./min. During the temperature-descending step, the temperature may be maintained at a constant value for a while or may be slightly raised for a while. The above-described temperature-descending rate is an average of cases.

In annealing A, at least one kind of gas selected from air and inert gases such as rare gases like argon or nitrogen gas is used as the gas containing water vapor. The concentration of the water vapor is preferably 0.001 mol % or more and is more preferably 0.014 to 2 mol % relative to the entire gas containing water vapor.

According to a thermal treatment containing such annealing A, water can be incorporated in the insulating film 24 at least near the surface.

Moreover, in annealing A, narrowing the temperature distribution in the annealing furnace by making the water-vapor-containing gas to flow in a constant direction is effective for achieving uniform incorporation of water into the oxide film (insulating film) throughout the substrate.

Then, a second conductive film 26 is formed by depositing a film of metal such as chromium, aluminum, titanium and molybdenum according to sputtering, for example. The second conductive film 26 is formed in a thickness of 50 to 300 nm, for example, and then is patterned by ordinary lithographic techniques and etching techniques. Subsequently, an ITO film is deposited by sputtering or the like to a thickness of 30 to 200 nm and pixel electrodes 34 in accordance with a predetermined pattern are formed by ordinary lithographic techniques and etching techniques.

In these steps, namely, the steps for sputtering the ITO film constituting the second conductive film 26 and the pixel electrodes 34, the deposition should preferably be carried out at a temperature less than 200° C. in order to prevent desorption of water that has been introduced into the insulating film 24 in the above-described step. If such deposition is carried out at 200° C. or above, the temperature should preferably be made uniform throughout the substrate so that water is contained as equally as possible in regions of the same depth in the insulating film 24. In order to achieve uniformity in temperature throughout the substrate, a heater larger than the substrate is used such that a radiation heat is uniformly applied throughout the substrate.

Incidentally, in the MIM nonlinear device 20 shown in FIG. 3, the second conductive film and the pixel electrodes are formed with a common transparent conductive film 36 including ITO or the like. In such a case, since the second conductive film and the pixel electrodes can be simultaneously formed, the manufacturing process can be simplified. The process for manufacturing the MIM nonlinear device shown in FIGS. 6 and 7 is basically the same as that for the MIM nonlinear device shown in FIGS. 1 and 2 although the patterns achieved by patterning or the like are different.

The present invention will be further illustrate with practical examples and comparative examples.

EXAMPLE 1

In the MIM nonlinear device of this example, the cross structure shown in FIGS. 1 and 2 was adopted. More specifically, a tantalum film (containing 0.2 atomic % of tungsten) having a thickness of 150 nm was deposited on a glass substrate by sputtering and patterned to form a first conductive film. Subsequently, anodic oxidation of the tantalum film was performed by constant-current electrolysis using a 0.05% by weight citric acid solution as a treatment solution at a current density of 0.04 mA/cm$^2$ until the voltage reached 30 V. As a result, a tantalum oxide film (insulating film) having a thickness of approximately 55 nm was formed.

Further, thermal treatment at 320° C. for 30 min. (annealing B shown in FIG. 8) was performed in a nitrogen atmosphere. The nitrogen atmosphere was then changed with an atmosphere containing a mixed gas of nitrogen and air [nitrogen:air=98.8:1.2 (volume ratio)] and 0.014% of water vapor, and a thermal treatment (annealing A shown in FIG. 8) was performed in which the temperature was decreased to 200° C. over a period of 120 min. at a temperature-descending rate of 1.0° C./min.

After this, chromium was deposited on the insulating film by sputtering to a thickness of 100 nm, and patterned to form a second conductive film and thus manufacture a MIM nonlinear device. The conditions for annealing A are shown in Table 1. Each value in the column "Temp." in Table 1 indicates the initial temperature for annealing A, namely, the temperature of the constant-temperature step in annealing B (T2 in FIG. 8).

EXAMPLE 2

Comparative Examples 1 and 2

These MIM nonlinear devices were manufactured in a manner similar to Example 1 except that thermal treatment was performed under the conditions shown in Table 1 instead of the annealing conditions in Example 1. Specifically, in Example 2 the annealing atmosphere was air and the content of water vapor was 1.2 mol %. In Comparative Example 1, the annealing treatment was not carried out. In Comparative Example 2, the annealing atmosphere included a mixed gas of nitrogen and air [nitrogen:air=80:20 (volume ratio)] without water vapor.

Experimental examples performed on the MIM nonlinear devices of Examples 1 and 2 and Comparative Examples 1 and 2 will be described below. The results of the experiments are shown in Table 1.

(a) Thermal Desorption Spectrum

EXAMPLE 1

Figure 9:
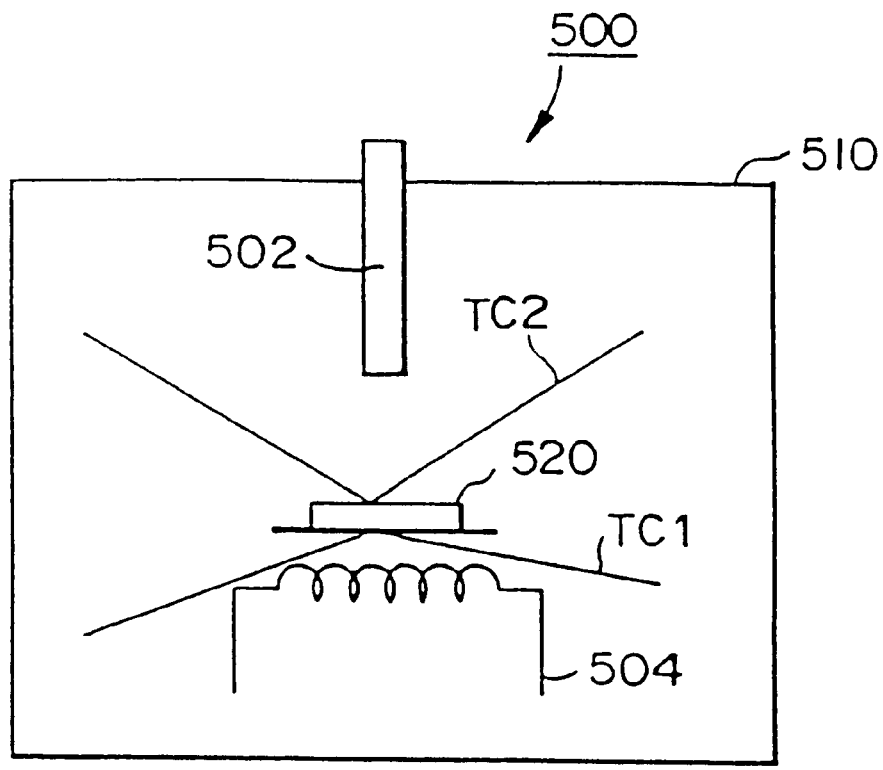
FIG. 9 is a schematic view of an apparatus for measuring thermal desorption spectroscopy.

A measurement on the insulating film according to a thermal desorption spectroscopy (TDS) method will be described. This measurement was performed using a thermal-desorption-spectroscopy-measuring apparatus 500 shown in FIG. 9.

This thermal-desorption-spectroscopy-measuring apparatus 500 includes a quadrupole mass-spectrometer 502 and an infrared heater 504 in a vacuum chamber 510. A sample 520 is heated by the infrared heater 504 from the back of the sample 520 and the gas derived from the sample 520 is measured by the quadrupole mass-spectrometer 502 to obtain a thermal desorption spectroscopy. For controlling the temperature of the sample 520, a thermocouple TC1 disposed on the back surface of the sample 520 was used in view of controllability. Additionally, a thermocouple TC2 was also provided on the front surface of the sample 520 in order to measure the surface temperature of the sample 520. Since the quartz substrate 522 used in the sample 520 was inferior in thermal conductivity and was as thick as 1.1 mm, there was a difference between the temperatures of the thermocouples TC1 and TC2. In an actual process for manufacturing a MIM nonlinear device, the temperature is substantially equal to the temperature at the thermocouple TC2. For TDS measurement, a quartz glass was used for the substrate since the substrate should be highly thermostable in order to be measured up to a high temperature of 1000° C. The voltage-current characteristic of the MIM nonlinear device is the same even if its substrate is replaced with an ordinary non-alkali glass.

Figure 10:
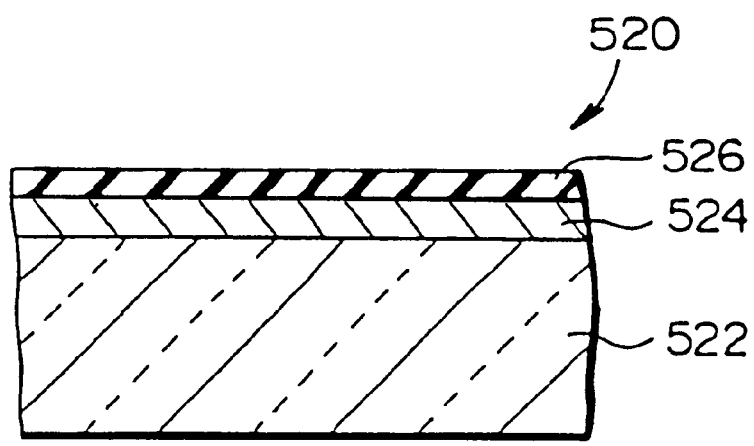
FIG. 10 is a schematic view of a sample used for measuring a thermal desorption spectroscopy.

FIG. 10 shows the sample 520 subjected to measurement. Initially, a tantalum film 524 (containing 0.2 atomic % of tungsten) having a thickness of 300 nm was formed on a quartz substrate 522 having a thickness of 1.1 mm by sputtering. Further, an insulating film 526 having a thickness of approximately 250 nm was formed according to anodic oxidation under the above-described conditions. Moreover, annealing B and annealing A were carried out under the above-described conditions to complete the step to incorporate water into the insulating film 526. The thus-obtained laminate was removed from the thermal-treatment furnace and subjected to the thermal-desorption-spectroscopy measurement as a sample 520.

Figure 11:
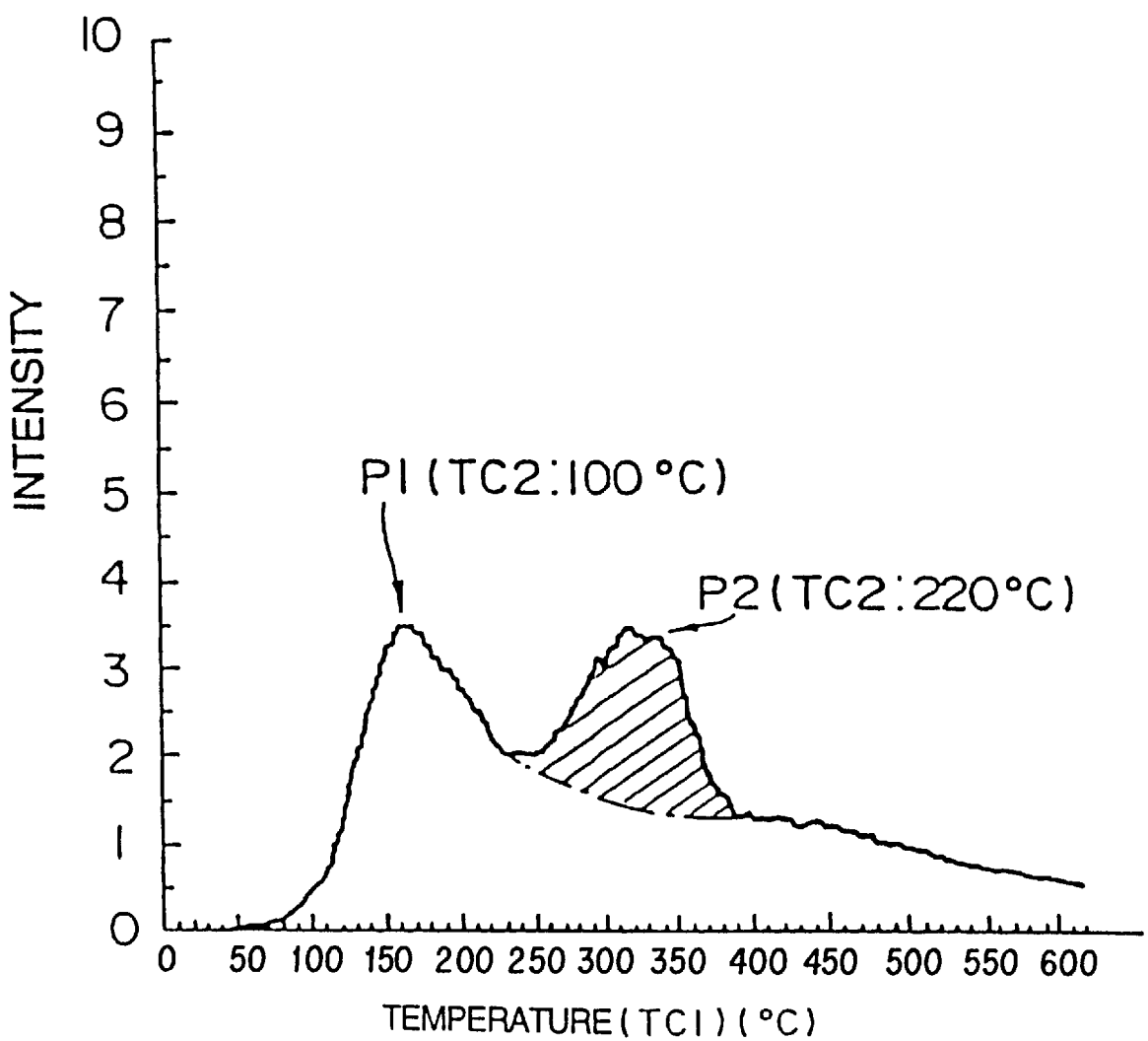
FIG. 11 is a diagram showing the thermal desorption spectroscopy of water measured for the insulating film in the MIM nonlinear device according to Example 1 of the present invention.

A thermal desorption spectroscopy of the sample 520 was measured and the results are shown in FIG. 11. In FIG. 11, the horizontal axis is the temperature (i.e., the temperature of the controlling thermocouple TC1) and the vertical axis is the measured-value intensity of the gas at a mass of 18 (H$_2$O) corresponding to water. In the spectrum shown in FIG. 11, there are two peak P1 and P2. As described above, the temperature of the thermocouple TC1 was different from that of the thermocouple TC2. As to the surface temperature of the sample 520, the temperature at the peak P1 according to the thermocouple TC2 was approximately 100° C. and the temperature at the peak P2 according to the thermocouple TC2 was approximately 220° C.

Figure 13:
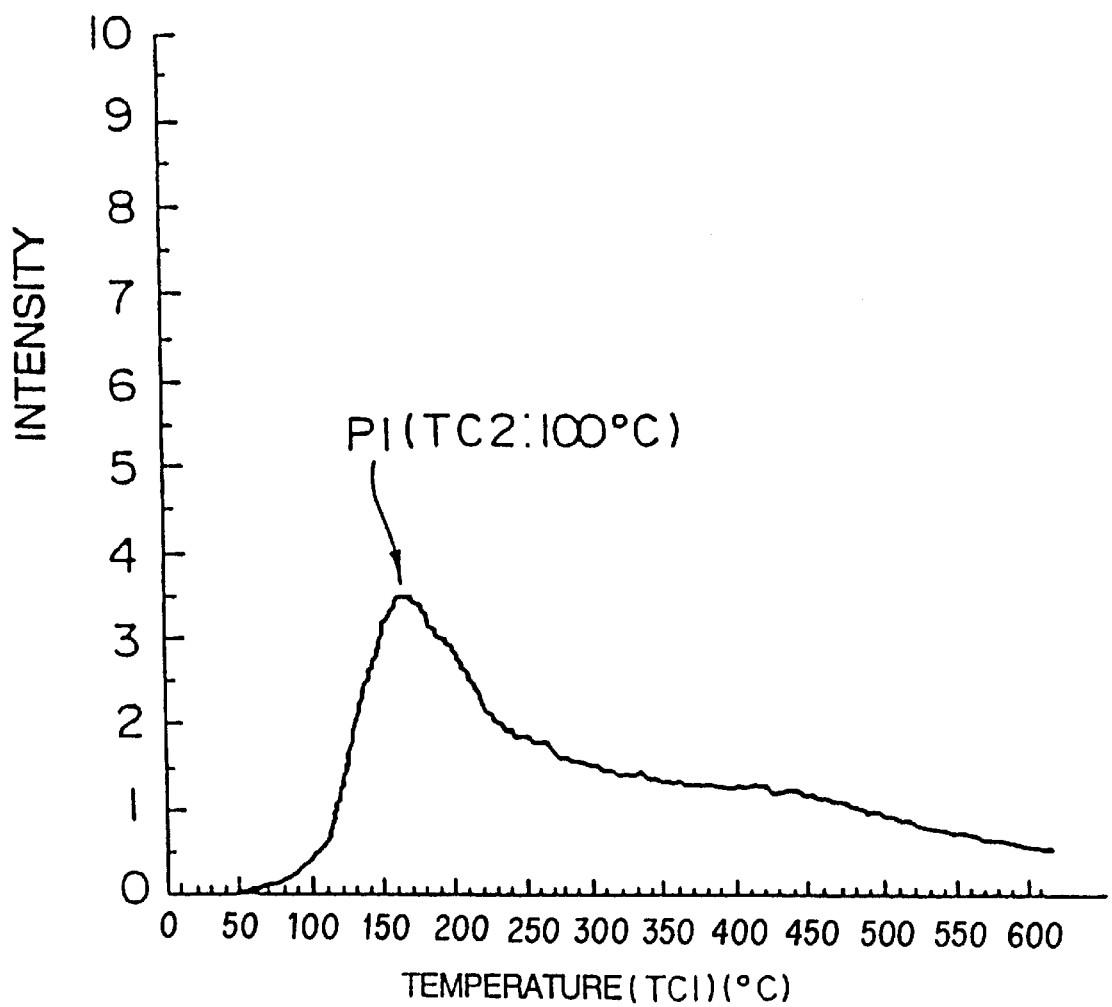
FIG. 13 is a diagram showing the thermal desorption spectroscopy of water measured for the insulating film in the MIM nonlinear device according to Comparative Example 1.

A sample corresponding to Comparative Example 1 manufactured without annealing was manufactured and subjected to measurement of the thermal desorption spectrum. The results are shown in FIG. 13. In the spectrum of FIG. 13, a peak P2 could not be observed. From FIGS. 11 and 13, the peak P1 can be considered to be derived from water physically adsorbed on the sample surface.

Figure 12:
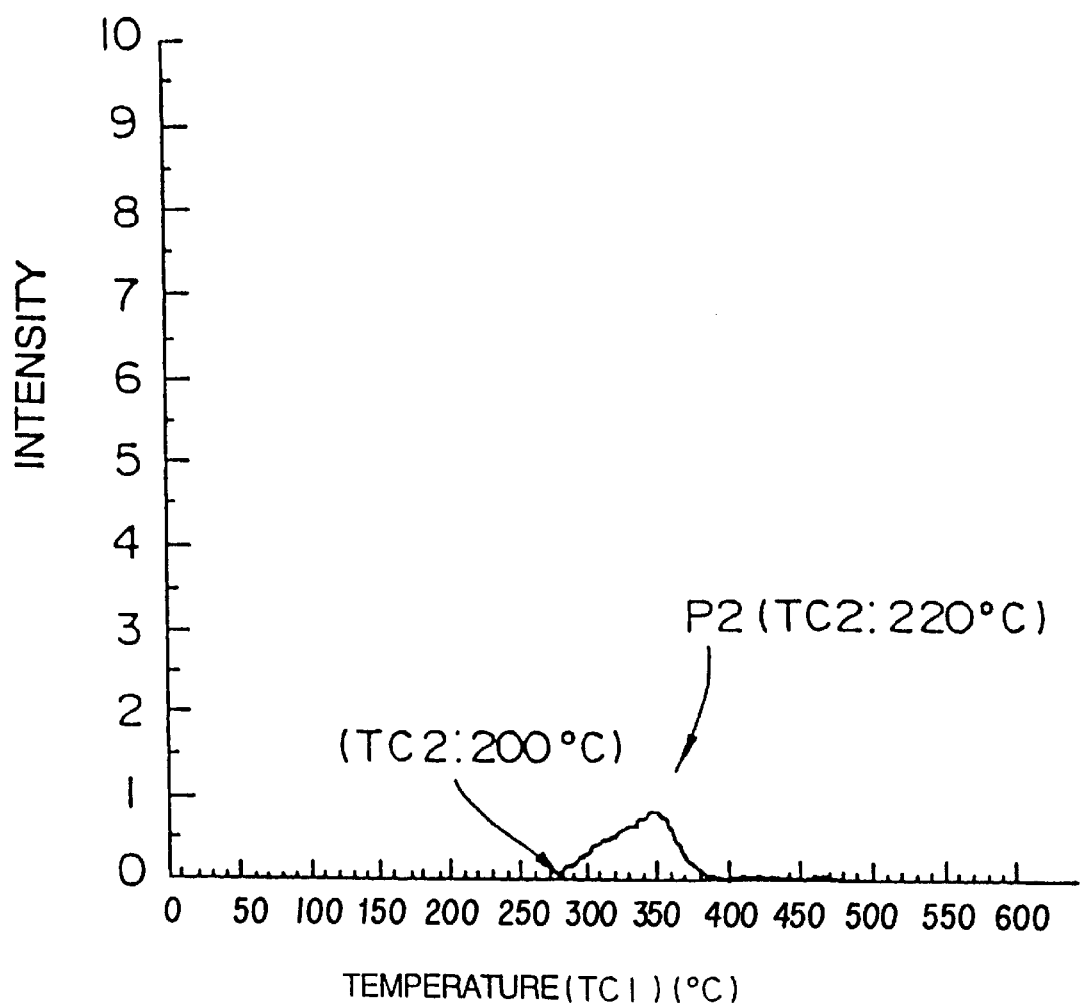
FIG. 12 is a diagram showing the thermal desorption spectroscopy of deuterium in the insulating film, measured to determine the origin of the peak P2 in the thermal desorption spectroscopy shown in FIG. 11.

The following experiment was performed to determine the origin of the peak P2. A sample was manufactured in a manner similar to the case of Example 1 except that annealing A was performed in an atmosphere in which the treatment gas contained heavy water ($D_2O$) instead of water used in annealing A of Example 1. This sample was subjected to a spectral measurement according to the TDS method at a mass of 20 corresponding to a peak of heavy water and the spectrum shown in FIG. 12 was observed. The peak in the spectrum of FIG. 12 was observed in the same temperature region as that where the peak P2 shown in FIG. 11 was observed. As is obvious from the above, the peak P2 (TC2: 220° C.) in FIG. 11 or 12 is derived from water introduced into the insulating film by annealing A in the atmosphere containing water vapor. Additionally, as is obvious from FIG. 12, the lower limit of the temperature of the peak P2 according to the thermocouple TC2 is approximately 200° C.

Further, the number of water molecules was calculated to be $5.75 \times 10^{14}/cm^2$ according to the integrated intensity in the peak P2 region of FIG. 11 (the region hatched with oblique lines).

MIM nonlinear devices manufactured in a similar manner, except that the thickness of the insulating film is altered, exhibits the same peak P2 integrated intensity in measurement of the thermal desorption spectroscopy. Further, the MIM nonlinear device manufactured with annealing A in an atmosphere containing heavy water exhibits the same voltage-current characteristic as that of the MIM nonlinear device manufactured with annealing A in an atmosphere containing water vapor.

Example 2 and Comparative Example 2

In a similar manner to Example 1, samples of Example 2 and Comparative Example 2 were subjected to measurement of the thermal desorption spectroscopy. As a result, in Example 2 a peak P2 was observed similar to Example 1 and the number of water molecules was $1.4 \times 10^{15}/cm^2$. In Comparative Example 2, a peak P2 could not be observed, which can be attributed to the absence of water vapor in annealing A.

(b) SIMS

EXAMPLE 1

Figure 14:
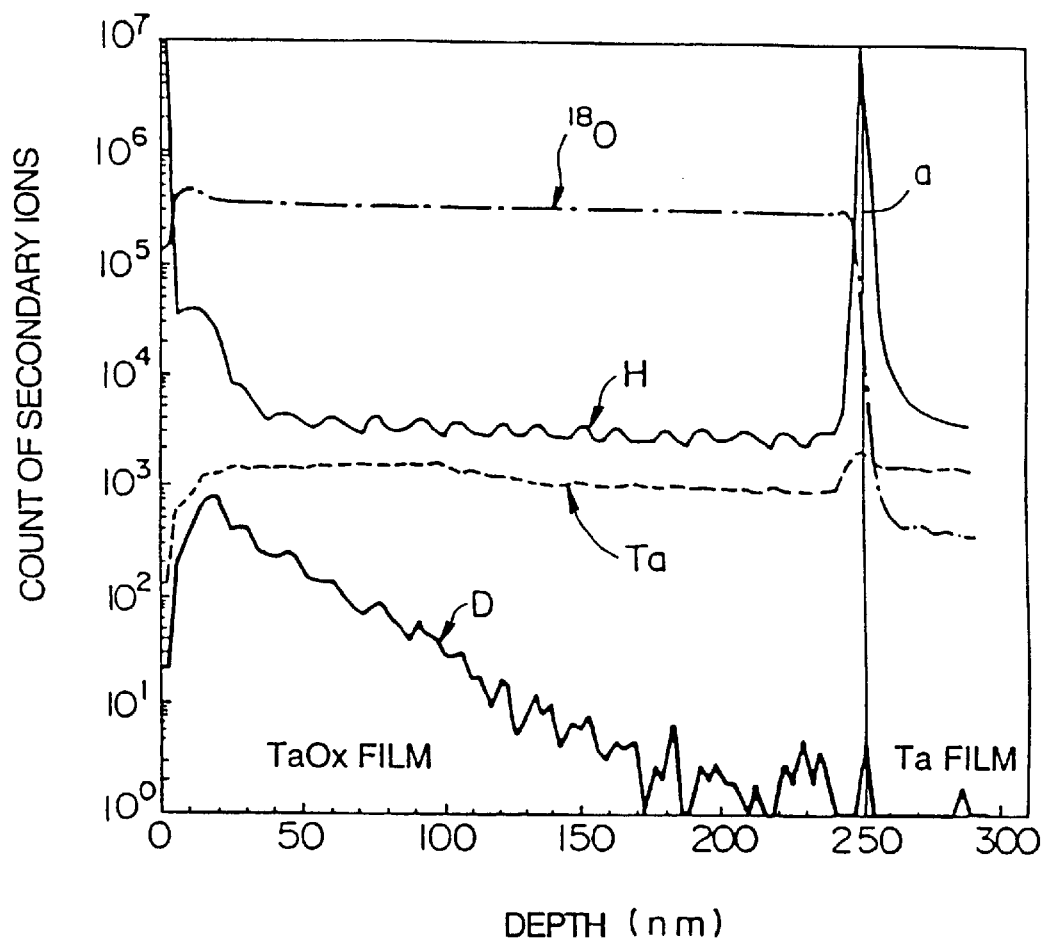
FIG. 14 is a diagram showing the SIMS spectrum measured for the first conductive film and the insulating film in the MIM nonlinear device according to Example 1 of the present invention.

SIMS based on cesium ion etching was performed in order to obtain the profiles of several atoms contained in the insulating film and the first conductive film. The results are shown in FIG. 14. In FIG. 14, the horizontal axis indicates the depth of each portion in the first conductive film and the insulating film from the surface of the insulating film and the vertical axis indicates the logarithm of the count of secondary ions. In FIG. 14, the line indicated by the symbol α passes the peak of the hydrogen spectrum and expediently indicates the boundary between the first conductive film and the insulating film. Further, in the measurement of SIMS, the thickness of the insulating film was set at 250 nm for readily observing the behavior of heavy water in the insulating film.

The sample used in this measurement had the same structure as the sample used for obtaining the TDS spectrum shown in FIG. 12. More specifically, the thermal treatment was performed using heavy-water vapor instead of water vapor in the atmosphere for annealing A. By using such a sample, the spectrum derived from hydrogen (H) and that derived from deuterium (D) in heavy water ($D_2O$) can be separately obtained as the spectra of FIG. 14.

As is obvious from FIG. 14, deuterium D derived from heavy water ($D_2O$) was contained in the insulating film (TaOx film), its spectrum has a peak near the surface of the insulating film (the surface faces the second conductive film), and the count of secondary ions gradually decreases in the direction of the thickness of the insulating film.

From the results of the thermal desorption spectroscopy (TDS) and SIMS, the following conclusion can be made. Initially, as to the results of TDS, since no film-thickness dependency was recognized in the integral intensity of the peak P2, water is locally incorporated in a portion of the insulating film by annealing A. Further, according to the SIMS spectrum shown in FIG. 14, the peak of deuterium appears within a range from the surface facing the second conductive film to 30 nm deep regardless of the thickness of the insulating film and the annealing condition. For example, when the thickness of the insulating film is 20 to 70 nm and the temperature for annealing B is 300 to 410° C., the peak appears in a depth of 10 to 20 nm from the surface facing the second conductive film. As is obvious from this data on TDS and SIMS, water is incorporated into the insulating film by annealing A and is localized in the insulating film portion closer to the second conductive film. Accordingly, if the insulating film is sufficiently thicker than the depth where the peak of the hydrogen spectrum derived from water appears, for example, if the insulating film is thicker than 20 nm, a water-containing region (first layer) and a region without water (second layer) are generated in the insulating film, namely, the insulating film has a structure in which insulating layers of different properties are joined. Hereupon, a region without water is defined as a region where the SIMS spectral value of hydrogen derived from water is smaller than the peak value by at least one order of magnitude in terms of the secondary ion count.

(c) Nonlinearity Coefficient (β Value)

The voltage-current characteristic of each MIM nonlinear device of Examples 1 and 2 and Comparative Examples 1 and 2 was examined and the nonlinearity coefficients (β values) representing the sharpness of the characteristic was calculated. The results are shown in Table 1.

As is obvious from Table 1, the β value becomes large relative to the increase in the number of water molecules contained in the insulating film. This may be attributed to the following. When the content of water in the insulating film increases, the energy difference between the conductive segments of the water-containing first layer and the non-water-containing second layer in the insulating film becomes large. The resistance of the MIM nonlinear device becomes large when a low voltage is applied to the device. As a result, the β value becomes large.

(d) Resistance Characteristics

In order to examine the resistance characteristics of each MIM nonlinear device of Examples 1 and 2 and Comparative Examples 1 and 2, the resistance value was measured when a voltage of 10 V was applied to the device. The results are shown in Table 1. In Table 1, each value is shown in terms of "R10V". This resistance characteristic "R10V" especially relates to the resistance value when a liquid crystal is put into an "on" state, and the value of "R10V" is preferably $2 \times 10^{10}$ Ω or below, and more preferably, $1 \times 10^{10}$ Ω or below in order to decrease the resistance of the device.

As is obvious from Table 1, the β values have been markedly improved in the examples according to the present invention, in which annealing A according to the present invention was performed to introduce water into the insulating film. Additionally, their resistance characteristics fall within a satisfactory range for practical uses.

TABLE 1

Annealing Conditions

|  | Temp. (°C.) | Atmosphere | WaterVapor (mole %) | Number of Water Molecules (/cm$^2$) | β Value | R10V. (Ω) |
| --- | --- | --- | --- | --- | --- | --- |
| Example 1 | 320 | N$_2$/Air | 0.014 | 5.7 E14 | 4.2 | 1.75E 9 |
| Example 2 | 320 | Air | 1.2 | 1.4 E15 | 5.2 | 2.00E10 |
| Comparative Example 1 | — | — | — | 0 | 3.0 | 4.00E 8 |
| Comparative Example 2 | 320 | N$_2$/O$_2$ | 0 | 0 | 3.1 | 2.13E 8 |

EXAMPLE 3

In the MIM nonlinear device of Example 3, the back-to-back structure shown in FIGS. 6 and 7 was adopted. More specifically, a tantalum film (containing 0.2 atomic % of tungsten) having a thickness of 150 nm was deposited on a glass substrate by sputtering and patterned to form a first conductive film. Subsequently, anodic oxidation of the tantalum film was performed by constant-current electrolysis using a 0.05% by weight citric acid solution as a treatment solution at a current density of 0.04 mA/cm$^2$ until the voltage reached 15 V. As a result, a tantalum oxide film (insulating film) having a thickness of approximately 30 nm was formed.

Further, a thermal treatment at 320° C. for 30 min. (annealing B shown in FIG. 8) was performed in a nitrogen atmosphere. After this, a thermal treatment (annealing A shown in FIG. 8) was performed under the conditions shown in Table 2. Specifically, the substrate temperature was decreased to approximately 200° C. by cooling it in the air (the amount of water vapor=1.2 mol %) at a temperature-descending rate of 1° C./min. over a period of 120 min. Subsequently, chromium was deposited on the insulating film by sputtering to a thickness of 100 nm and patterned to form a second conductive film thus manufacturing the MIM nonlinear device of Example 3.

EXAMPLES 4 TO 7

Comparative Example 3

MIM nonlinear devices were manufactured in a similar manner to Example 3 except that the annealing conditions were changed to those in Table 2.

Experimental examples performed on the examples and the comparative example will be described below. The results of the experiments are shown in Table 2.

Figure 15:
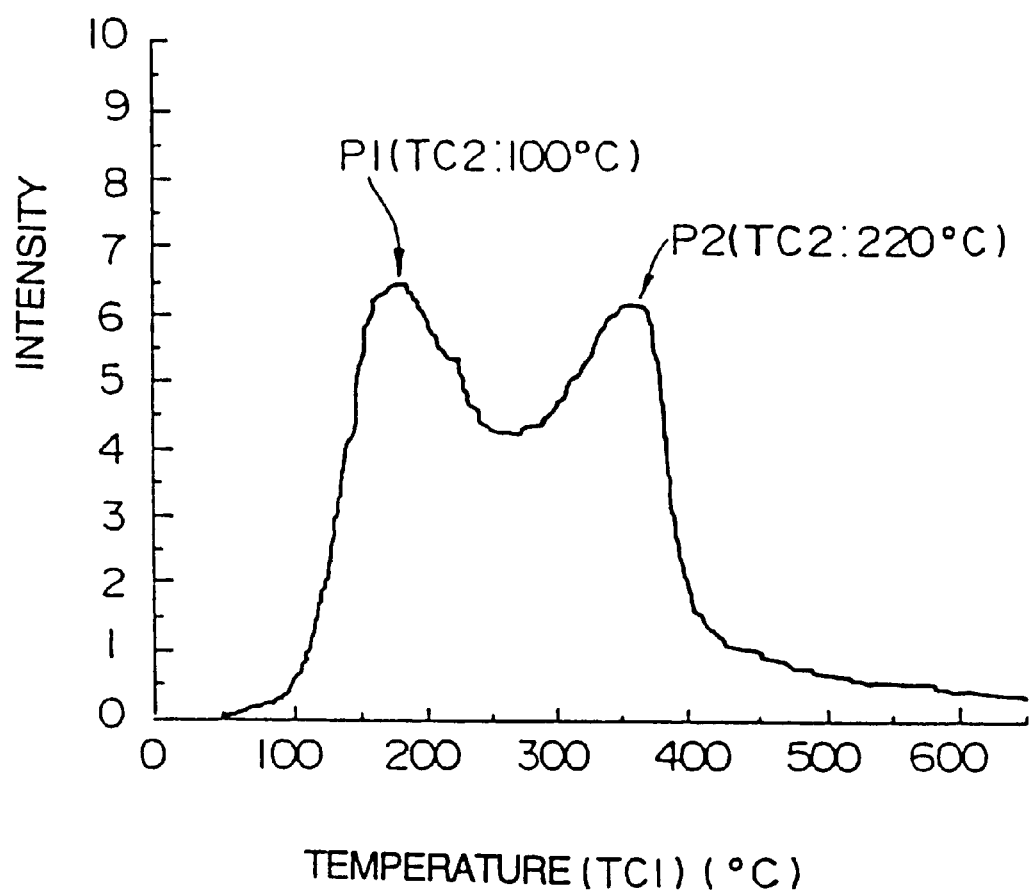
FIG. 15 is a diagram showing the desorption spectroscopy of water measured for the insulating film in the MIM nonlinear device according to Example 4 of the present invention.
Figure 16:
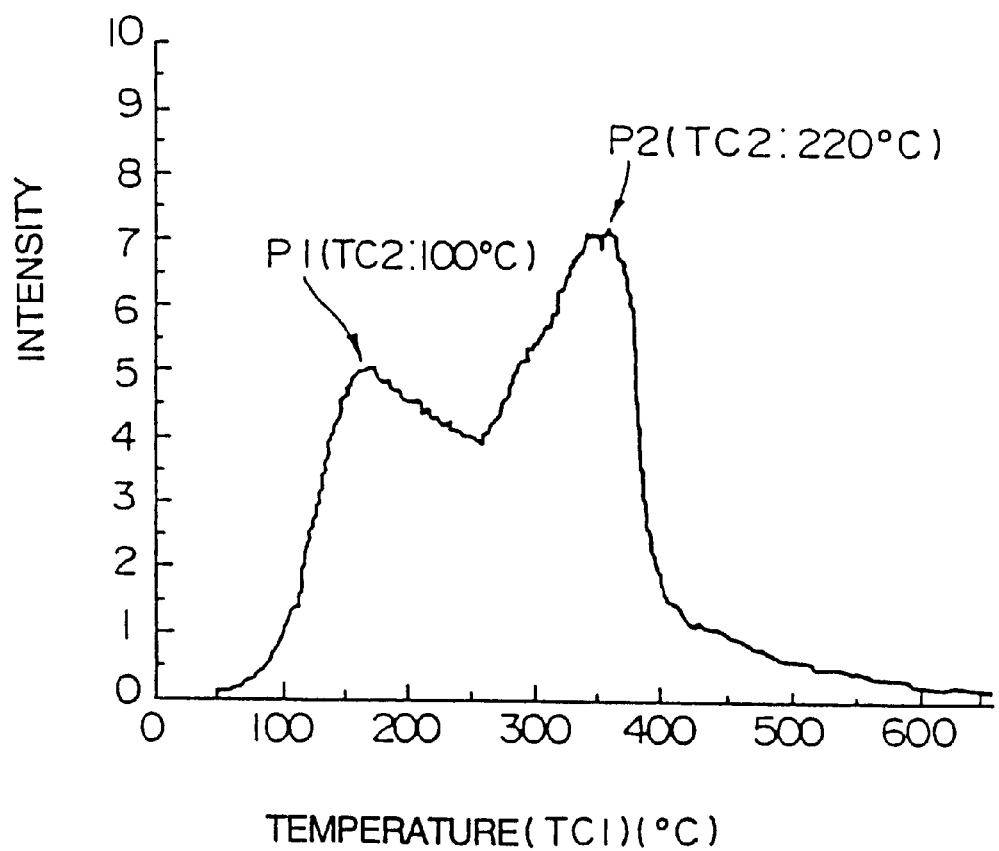
FIG. 16 is a diagram showing the desorption spectroscopy of water measured for the insulating film in the MIM nonlinear device according to Example 7 of the present invention.
Figure 17:
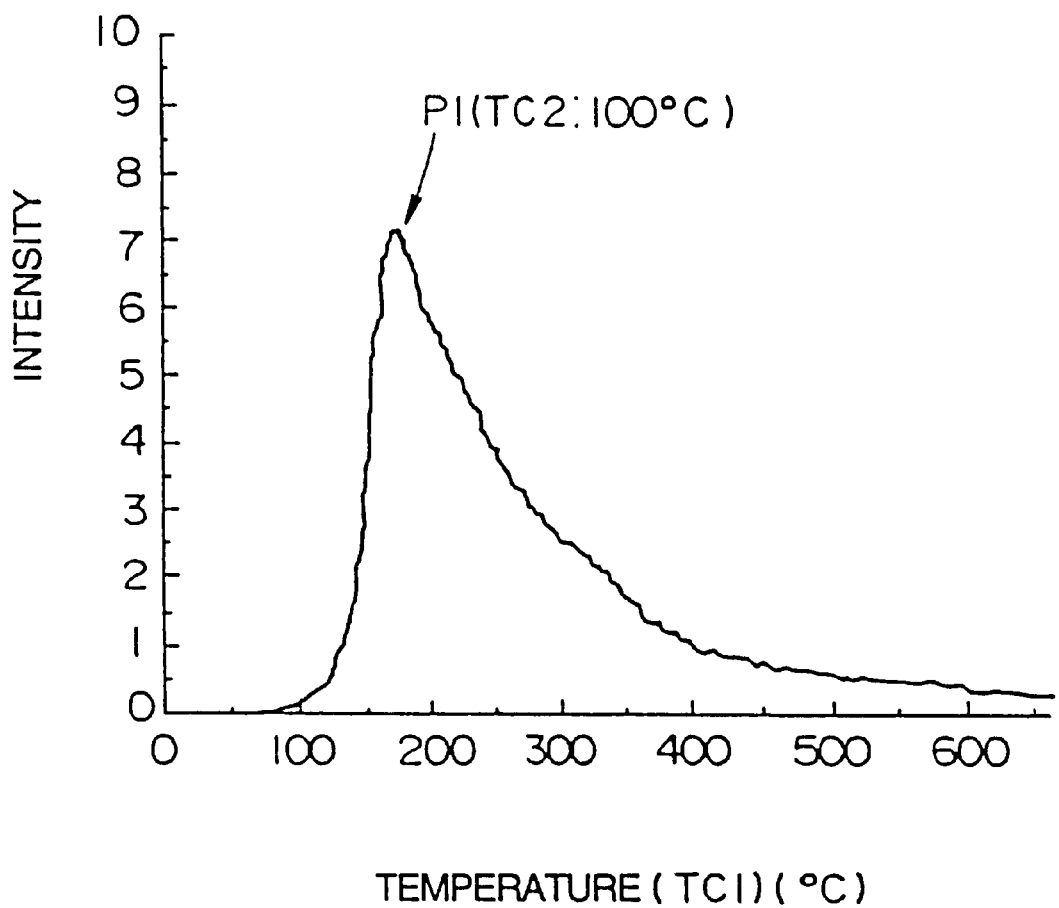
FIG. 17 is a diagram showing the thermal desorption spectroscopy of water measured for the insulating film in the MIM nonlinear device according to Comparative Example 3.

The devices of Examples 4 and 7 and Comparative Example 3 were subjected to measurement of the thermal desorption spectroscopy. The results are shown in FIGS. 15, 16 and 17, respectively. In each of FIGS. 15 and 16, peaks P1 and P2 are present. Meanwhile, the spectrum of Comparative Example 3 shown in FIG. 17 has only a peak P1. It has been found that water cannot be contained in the insulating film without the annealing treatment.

Figure 18:
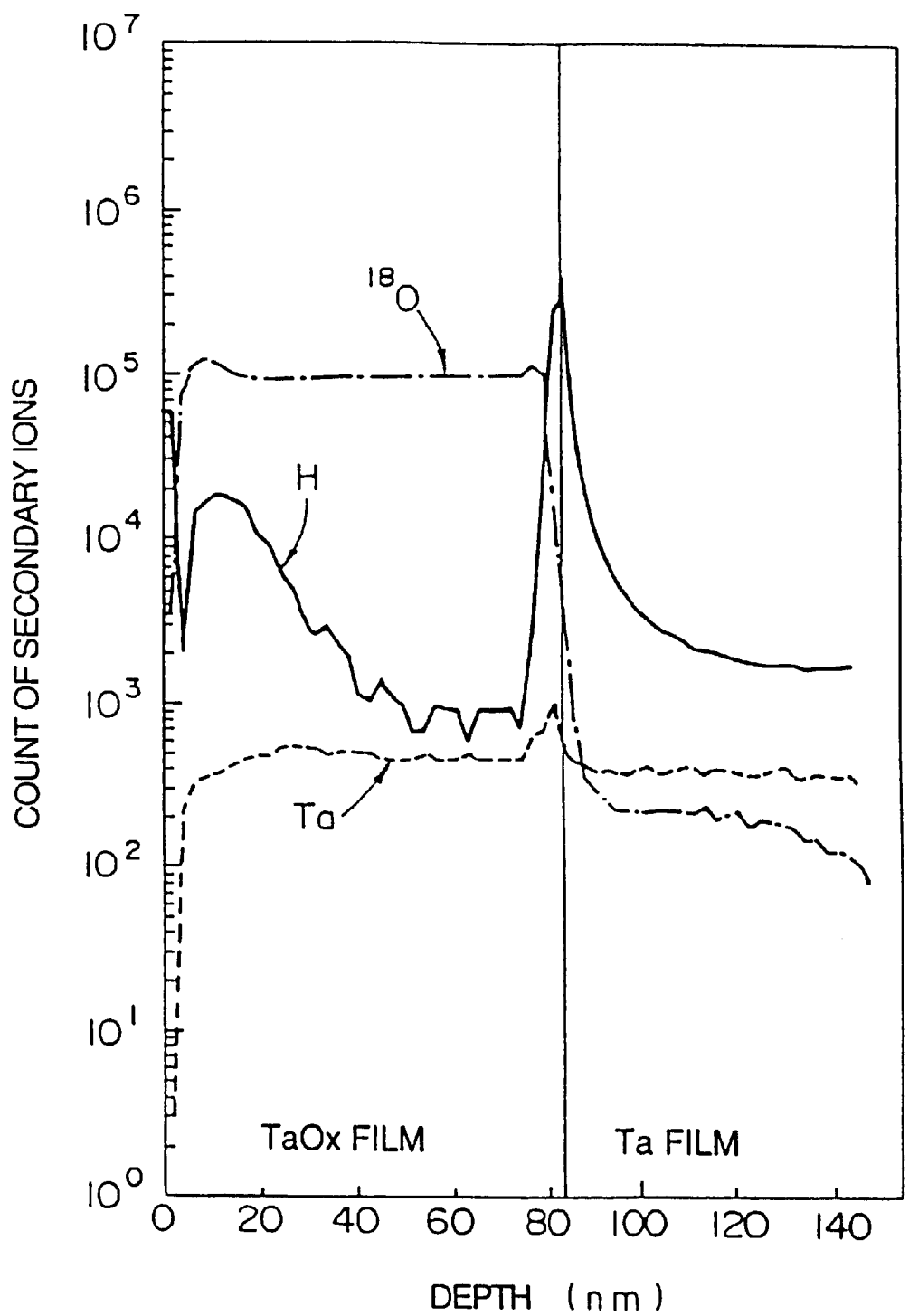
FIG. 18 is a diagram showing the SIMS spectrum measured for the MIM nonlinear device according to Example 4 of the present invention.
Figure 19:
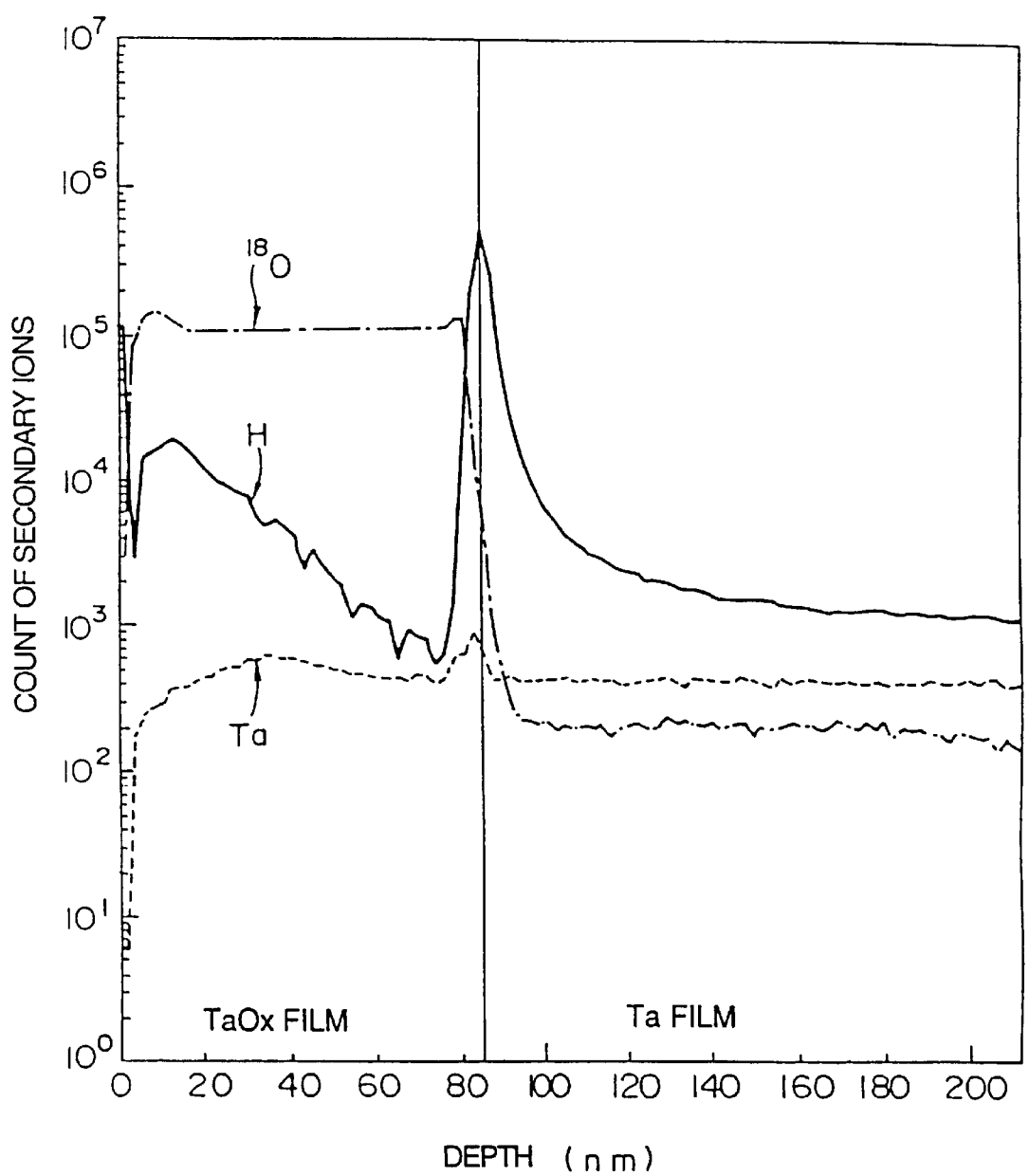
FIG. 19 is a diagram showing the SIMS spectrum measured for the MIM nonlinear device according to Example 7 of the present invention.
Figure 20:
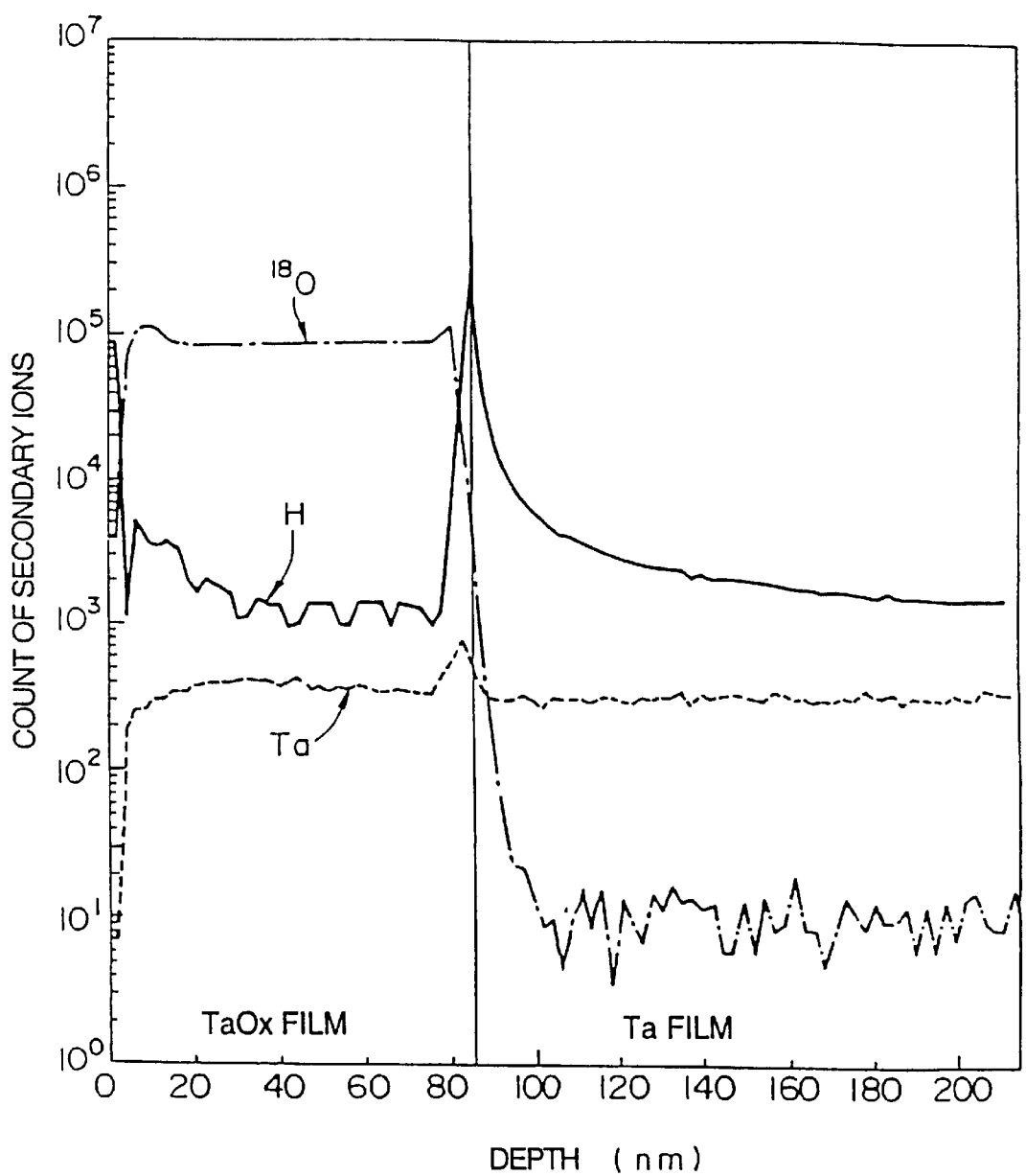
FIG. 20 is a diagram showing the SIMS spectrum measured for the MIM nonlinear device according to Comparative Example 3.

Further, the devices of Examples 4 and 7 and Comparative Example 3 were subjected to measurement of SIMS. The results are shown in FIGS. 18, 19 and 20, respectively. Each hydrogen spectrum of Example 4 or 7 in which annealing A was performed has a peak near the surface of the insulating film. Since this hydrogen spectrum is the sum of that derived from hydrogen atoms and that derived from hydrogen in water, it is not the spectrum of hydrogen derived from water in the insulating film from a strict point of view. Nevertheless, the peak near the surface of the insulating film (the surface faces the second conductive film) can indirectly be regarded to be derived from water in the insulating film by comparison with the hydrogen spectrum shown in FIG. 20 of Comparative Example 3 having an insulating film not containing water. Incidentally, in the measurements, the results of which are shown in FIGS. 15 to 20, the thickness of each sample insulating film was set at 85 nm for the convenience of grasping the measurement results on the thermal desorption spectrum and SIMS.

Moreover, the devices of Examples 3 to 7 and Comparative Example 3 were subjected to examination of the β value and resistance characteristics (R10V), and the results are shown in Table 2. As is obvious from Table 2, the devices of the examples according to the present invention exhibit extremely increased β values and sufficiently superior resistance characteristics as compared with the device of Comparative Example 3 in which the annealing was not performed.

TABLE 2

Annealing Conditions

|  | Temp. (°C.) | Atmosphere | WaterVapor (mole %) | Number of Water Molecules (/cm$^2$) | β Value | R10V. (Ω) |
| --- | --- | --- | --- | --- | --- | --- |
| Example 3 | 300 | Air | 1.2 | — | 4.8 | 1.79E9 |
| Example 4 | 320 | Air | 1.2 | 1.4E15 | 5.0 | 2.28E9 |
| Example 5 | 350 | Air | 1.2 | — | 5.2 | 3.23E9 |
| Example 6 | 380 | Air | 1.2 | — | 5.5 | 4.90E 9 |
| Example 7 | 410 | Air | 1.2 | 2E15 | — | — |
| Comparative Example 3 | — | — | — | 0 | 2.7 | 6.00E8 |

Furthermore, a liquid-crystal display panel was manufactured using the MIM nonlinear device of Example 1. As a result, contrast values of 100 or higher could be achieved in a temperature range of 0 to 80° C. without image irregularity.

While the invention has been described in relation to preferred embodiments, many modifications and variations are intended to be within the scope of the present invention as defined in the appended claims.

What is claimed is:

1. A two-terminal nonlinear device comprising:

a first conductive film formed on a substrate;

an insulating film formed over the first conductive film; and a second conductive film formed over the insulating film, wherein said insulating film contains water at a content gradient descending in a direction of a film thickness of the insulation film from a surface facing said second conductive film.

2. The two-terminal nonlinear device according to claim 1, wherein an hydrogen spectrum of said water obtained by a secondary ion-mass spectrography elemental analysis with a radiation of cesium primary ions exhibits a peak near the surface of said insulating film facing said second conductive film.

3. The two-terminal nonlinear device according to claim 2, wherein said peak is exhibited in said insulating film within a range from the surface of said insulating film facing said second conductive film to 30 nm deep.

4. The two-terminal nonlinear device according to claim 2, wherein an intensity of the hydrogen spectrum of said water based on a secondary ion-mass spectrography elemental analysis with the radiation of cesium primary ions varies in said insulation film by at least one order of magnitude.

5. The two-terminal nonlinear device according to claim 1, wherein a thermal desorption spectroscopy of said insulating film has a peak derived from water in said insulating film within a range of 220° C.±5° C.

6. The two-terminal nonlinear device according to claim 1, wherein said first conductive film comprises one of tantalum and a tantalum alloy.

7. The two-terminal nonlinear device according to claim 1, wherein said insulating film is formed by anodic oxidation of said first conductive film.

8. A liquid-crystal display panel comprising:

a first substrate having a transparent substrate, a signal line formed on said transparent substrate based on a predetermined pattern, a two-terminal nonlinear device according to claim 1 connected to said signal line, and a pixel electrode connected to said two-terminal nonlinear device;

a second substrate provided with another signal line disposed in a position opposite to said pixel electrode; and a liquid-crystal layer sealed between said first and second substrates.

* * * * *